(12) United States Patent
Lin et al.

(10) Patent No.: US 8,467,258 B2
(45) Date of Patent: Jun. 18, 2013

(54) METHOD AND APPARATUS FOR BIT CELL REPAIR

(75) Inventors: Sung-Chieh Lin, Zhubei (TW); Jiann-Tseng Huang, Hsinchu (TW); Wei-Li Liao, Taichung (TW); Kuoyuan Hsu, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 239 days.

(21) Appl. No.: 12/871,417

(22) Filed: Aug. 30, 2010

(65) Prior Publication Data

US 2012/0051162 A1 Mar. 1, 2012

(51) Int. Cl.
*G11C 29/04* (2006.01)

(52) U.S. Cl.
USPC ............ 365/200; 365/230.08; 714/773

(58) Field of Classification Search
USPC ............... 365/200, 230.08; 714/773
See application file for complete search history.

(56) References Cited

U.S. PATENT DOCUMENTS

2010/0157704 A1* 6/2010 Iwaki ............... 365/200
2010/0211853 A1* 8/2010 Madan et al. ........ 714/773

* cited by examiner

*Primary Examiner* — Toan Le
*Assistant Examiner* — Hai Pham
(74) *Attorney, Agent, or Firm* — Duane Morris LLP

(57) ABSTRACT

A method includes reading data from a subset of a plurality of memory bit cells of a non-volatile memory. The data identifies an address of at least one individual failed bit cell. The method further includes loading the data directly into a register, receiving an address of data to be accessed, determining if the received address is the address of any individual failed bit cell; and accessing the data of the register if the received address is the address of any individual failed bit cell.

15 Claims, 6 Drawing Sheets

METHOD AND APPARATUS FOR BIT CELL REPAIR

BACKGROUND

Memory storage units known as bit cells store information in the form of single bits. Static random access memory (SRAM) is a type of semiconductor memory that stores data in the form of bits using bistable circuitry without the need for refreshing. In a volatile memory such as SRAM, stored information therein is not retained after a power-down or power off event. In contrast, non-volatile memories store their contents after power is turned off and such contents are available for access upon subsequent power-on. Memory arrays include multiple bit cells arranged in rows and columns. Each bit cell in a memory array typically includes connections to a power supply voltage and to a reference voltage. Bit lines are used for accessing a bit cell, with a word line controlling connections to the bit lines. A word line may be coupled to the bit cells in a row of a memory array, with different word lines provided for different rows.

A failed bit cell may result in incorrect storage of data and unreliable reads/writes to/from the bit cell. Failure of bit cells in a memory array is a challenge for the data storage industry. The major failure mode encountered in practice is a random single bit (individual bit failure) as opposed to failure of an entire row (e.g., word line) or bit line.

BRIEF DESCRIPTION OF THE DRAWINGS

The following will be apparent from elements of the figures, which are provided for illustrative purposes and are not necessarily to scale.

DETAILED DESCRIPTION

This description of the exemplary embodiments is intended to be read in connection with the accompanying drawings, which are to be considered part of the entire written description.

Figure 1A:
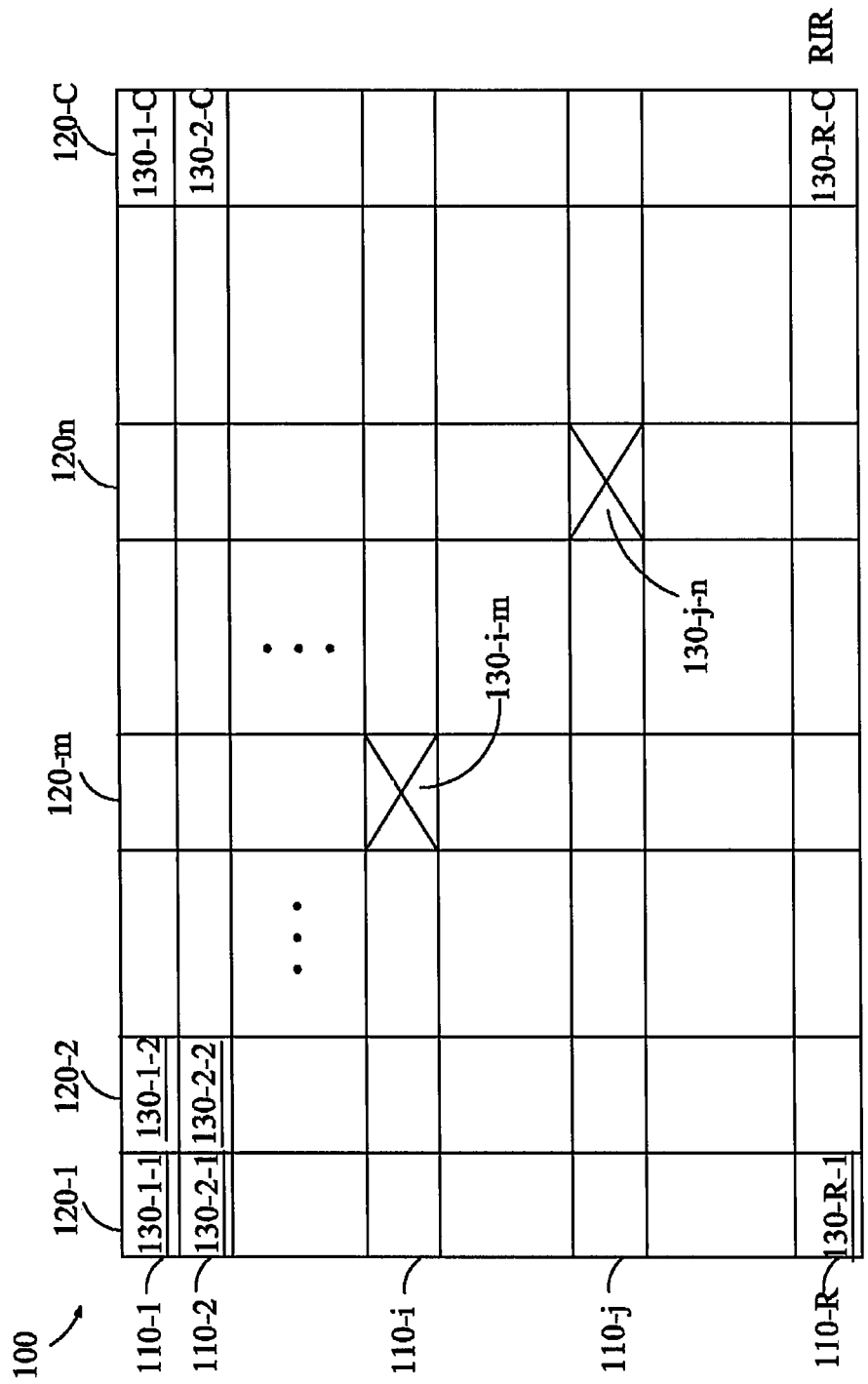
FIG. 1A is a block diagram of a bit cell array in accordance with some embodiments.

FIG. 1A is a block diagram of a bit cell array in accordance with some embodiments. A memory array 100 is arranged in rows 110-1, 110-2, ..., 110-R (collectively 110) and columns 120-1, 120-2, ..., 120-C (collectively 120). The memory array 100 is a non-volatile memory, e.g., an e-flash memory, an e-fuse memory, or a one-time programming (OTP) memory. Bit cells 130-1-1, 130-1-2, ..., 130-1-C (collectively 130) populate a first row 110-1 of the array 100, bit cells 130-1-1, 130-2-1, ..., 130-R-1 populate a first column 120-1, and similar labeling conventions apply for the other bit cells. As an example, the number of rows in the array 100 may be 128 (i.e., R=128), and the number of columns may be 32 (i.e., C=32), to yield a 4 kb memory, although other sizes, e.g., 64 rows and 64 columns, may be used as well.

Data bits may be stored at bit cells 130. A bit cell in the array 110 may fail; for example, a single bit cell 130-$i$-$m$ may fail. In some embodiments, information associated with the individual failed bit cell 130-$i$-$m$ is copied to a dedicated (reserved) portion of the array 100, which may be a row called a redundant information row (RIR) 110-R. It is not necessary to copy information for an entire row (or column) containing bit cell 130-$i$-$m$; information for failed bit cell 130-$i$-$m$ individually (e.g., alone) is copied to the dedicated array portion.

The RIR is shown in FIG. 1A as being the last row 110-R of the array 100, although any other row 110 may be used for redundancy as well. The dedicated portion of the array 100 may be a group of bit cells other than a row, e.g., a portion of a row or more than a single row; in some embodiments, certain efficiencies are gained by using a row for redundancy, as described further below. By storing information associated with a first individual failed bit cell 130-$i$-$m$ in a reserved portion (e.g., RIR) of the array 100, the failed bit cell is effectively repaired as described in detail further below. In some embodiments, a second individual failed bit cell 130-$j$-$n$ (or more individual failed bit cells), which is in a different row and column than the failed bit cell 130-$i$-$m$, has its associated information copied to the reserved portion of the array 100 to enable repair for that bit cell as described below. A second or subsequent failed bit can be repaired using the RIR, regardless of whether in the same or different row, and the same or different column, as the first failed bit. For the following examples, a redundant information row (RIR) is discussed, although other portions of the array 100 may be used as well, as described above, e.g., a portion of a row, multiple rows, a column, a portion of a column, or multiple columns.

Figure 1B:
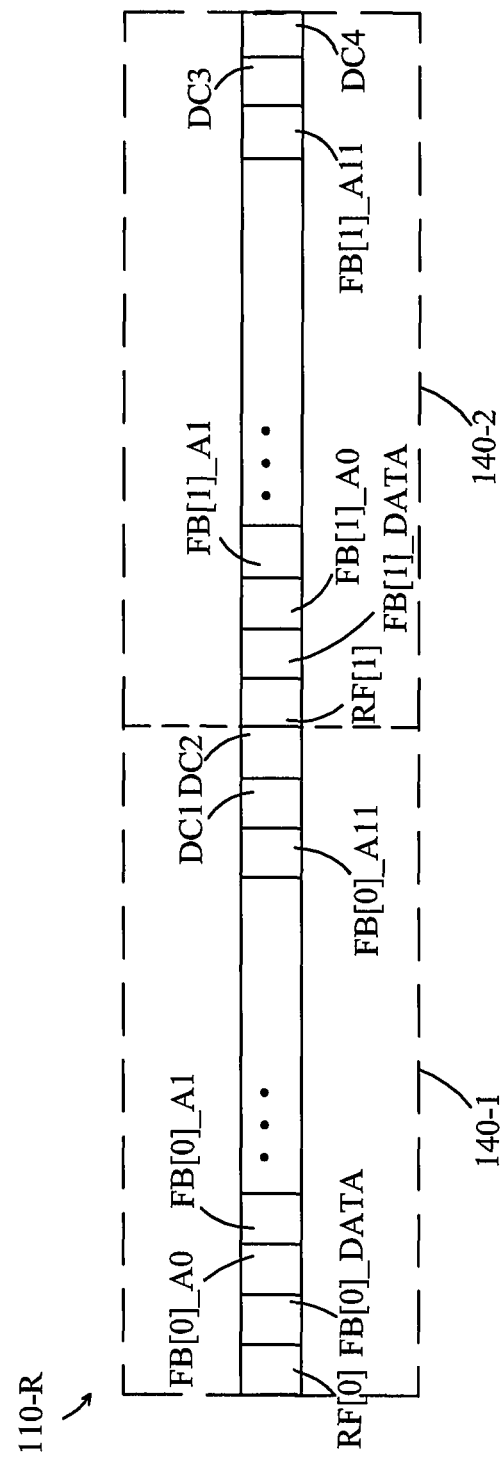
FIG. 1B is a block diagram of a redundant information row (RIR) in accordance with some embodiments.

FIG. 1B is a block diagram of a redundant information row (RIR) in accordance with some embodiments. RIR 110-R may include a first section 140-1 to store information associated with a first failed bit cell and a second section 140-2 to store information associated with a second failed bit cell. The RIR may have sections for more than two failed bit cells (or just one bit cell) in other examples.

A redundancy flag is provided for each section to indicate whether that section is being used or is unused currently for bit cell repair purposes. Suppose an individual bit cell has failed, e.g., bit cell 130-$i$-$m$ of FIG. 1A. Setting redundancy flag RF[0] to 1 indicates that section 140-1 of the RIR is currently being used to store information associated with an individual failed bit cell, the location of which is specified in the address bits field described below.

A payload bit FB[0]$_{13}$ DATA may be used to store data that would ordinarily be stored at failed bit cell 130-$i$-$m$ but cannot be stored at that failed bit cell due to the failure. As used herein, the term "payload bit" refers to both the bit cell used to store such payload information and the payload information itself (i.e., the payload bit of data stored at the payload bit cell), as one of ordinary skill in the art readily understands. A similar convention applies for other bit cells/bits in the RIR, e.g., address bits described below. Usage of the payload bit is described in detail further below.

Address bits FB[0]_A0, FB[0]_A1, ..., FB[0]_A11 store address information associated with the address of the individual failed bit cell 130-$i$-$m$. In this example, twelve address bits are reserved for this purpose, corresponding to an array size of $2^{12}$=4096 bit cells. With other memory array sizes, other numbers of bits may be used to store such address information. Address bits FB[0]_A0, ..., FB[0]_A11 may store the address of failed bit cell 130-$i$-$m$ by an indexing convention using column/row offsets known in the art, to associate each of the 4096 bit cells with a unique 12-bit binary address.

By providing addressing bit cells in a redundant information row (RIR), embodiments provide a logical repair mechanism to repair failed bit cells. An address of an individual failed bit cell is stored in address bits of the RIR, the payload data value that would ordinarily be stored at the failed bit cell is stored in the payload bit, and the redundancy flag is set to indicate usage of bit cells in the RIR for repair of failed bit cells. Providing a logical repair mechanism advantageously avoids significant area increase (i.e., increase in area of a storage device) by only adding one row to the overall memory array in some embodiments. Multiple rows may be added in other embodiments, but the area increase is still minor, e.g., compared to physical bit cell failure repair techniques whereby an entire row (or bit line) is rerouted to a separate row. The RIR (or other similar portion of memory dedicated to store information associated with failed bit cells) is mutually exclusive from the portion of memory that comprises bit cells used for general-purpose data storage (e.g., bit cells in rows other than row 110-R in the example of FIG. 1A). Providing a logical repair mechanism enables embodiments to efficiently target individual failed bit cells for repair without having to provide repair functionality for an entire row, which may contain several non-failed (i.e., working) bit cells.

In the example shown in FIG. 1B, "don't care" bit cells DC1 and DC2 may be reserved for future use or may be unused. With 32 bit cells in a row and thus 16 bit cells for a section in a RIR corresponding to an individual failed bit cell, using one bit for a redundancy flag, one bit for payload, and twelve bits for addressing leaves these two bits cells as "don't care" bit cells. In the case of a second individual failed bit cell, e.g., bit cell 130-j-n of FIG. 1A, section 140-2 of the RIR may be used as well for bit cell failure recovery. Bit cells in section 140-2 have similar roles as those in section 140-1 and are indexed with "[1]" instead of "[0]". Don't care bit cells DC3 and DC4 for section 140-1 are shown in FIG. 1B. Bit cells in the RIR may be assigned in other ways (i.e., other bit-orderings) to the roles of redundancy flag, payload, and addressing, as known to one of ordinary skill in the art.

Figure 2:
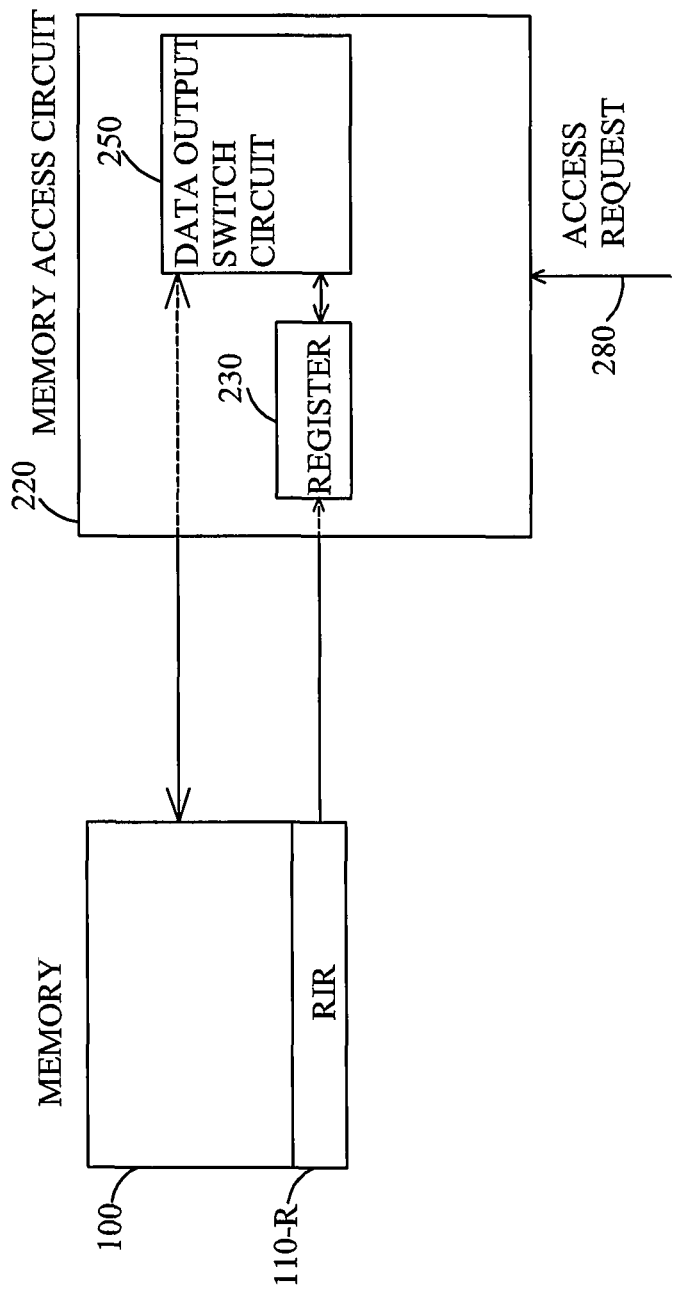
FIG. 2 is a block diagram of a data storage system in accordance with some embodiments.

FIG. 2 is a block diagram of a data storage system in accordance with some embodiments. In some embodiments, upon a power-on event of memory 100, the contents of the RIR 110-R are copied (stored, or loaded) directly to a register 230, which may be part of a memory access circuit 220, or located on the same IC chip as the memory access circuit 220, for low latency. The memory access circuit 220 may be part of a peripheral circuit. Loading the contents of the RIR 110-R to the register 230 is possible because the memory 100 is non-volatile and thus retains its contents after a preceding power-off or power-down event. The register 230 may include bit fields (bit storage locations) corresponding to equivalent locations in the RIR. For example, if the RIR has 32 bit cells, the register 230 may have 32 bits of storage as well, with bit assignments for the register 230 as in FIG. 1B corresponding to the RIR. Upon a request 280 to access a bit cell, the register is accessed to determine whether the bit cell to be accessed is a failed bit cell. The access request 280 comprises the address of the bit cell to be accessed. For an access (read from or write to) a failed bit cell, accesses may be made to/from the register 230 instead of from memory 100, resulting in faster performance. Because the register may be a "mirror" of the RIR in terms of bit assignments, data accesses to/from the register are faster than accesses to/from the memory 100. An address comparison is performed to determine whether a memory address to be accessed corresponds to the address in a valid entry in the RIR 110-R (i.e., an entry for which the redundancy flag is set). The register 230 may perform the address comparison. Depending on that address comparison, which may occur in under 1 ns in some embodiments, a data output switch circuit 250, which may be part of the memory access circuit 220, may access the register 230, if the RIR 110-R has a valid entry for that address, or the memory 100, if the RIR 110-R does not have a valid entry for that address. For example, if the register 230 determines that a memory address to be accessed is not stored in a valid entry of the RIR 110-R, the processor 220 accesses the requested datum in memory 100; if the address to be accessed corresponds to a failed bit cell, the processor 220 accesses the requested datum in register 230 without incurring the delay of retrieving the datum from memory 100.

Figure 3:
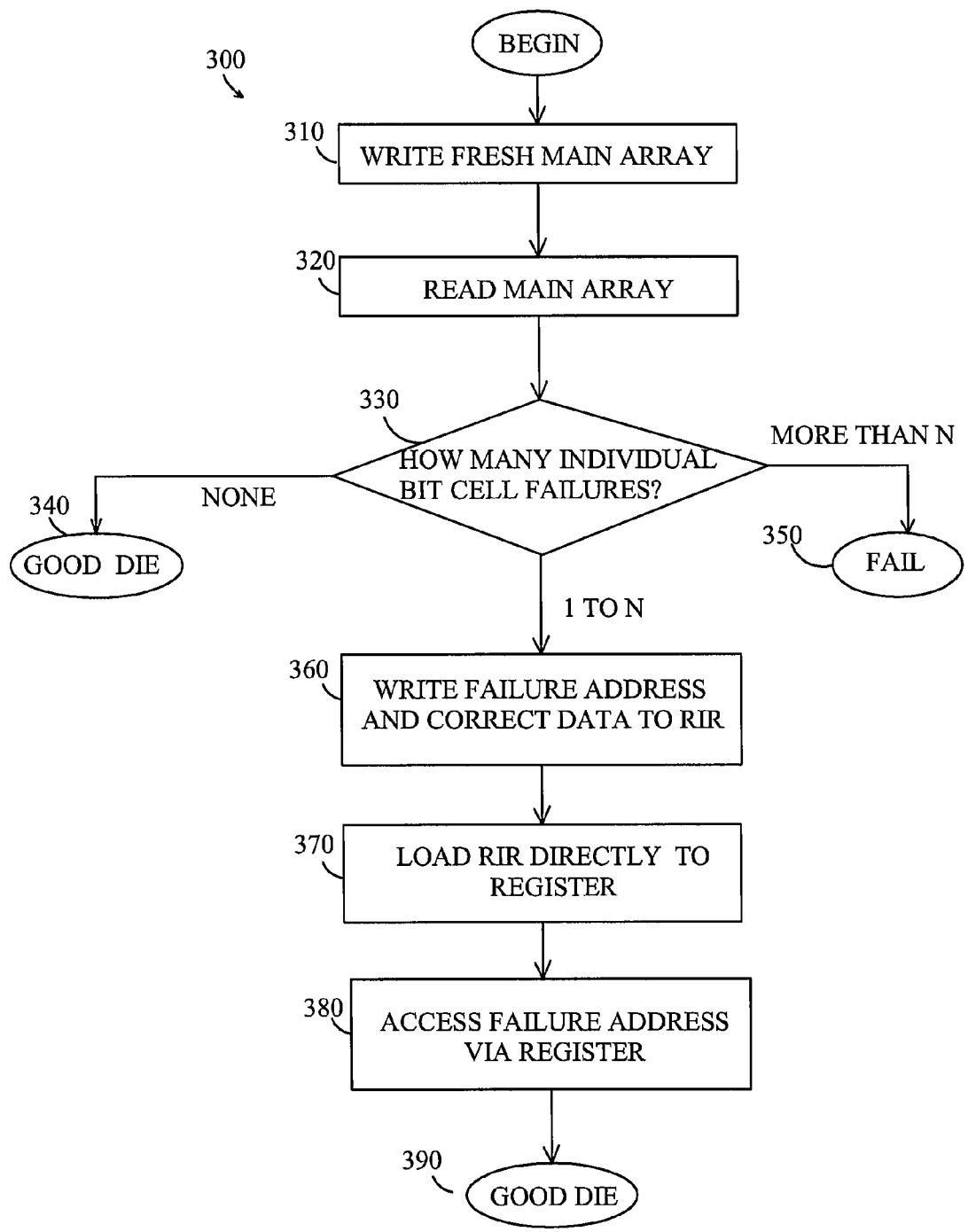
FIG. 3 is a flow diagram of a process in accordance with some embodiments.

FIG. 3 is a flow diagram of a process in accordance with some embodiments. After process 300 begins, a main part of a memory array (i.e., a part other than the RIR 110-R) may be written to freshly with test data at 310. Prior to such writing, the array may be "clean", i.e., with no data written to it. A user who has received a die including a memory array may perform such writing via a suitable automated system. The automated system may then read the newly written data as part of a test sequence at 320 to determine whether any bit cells have failed. Various test data patterns may be written and read at steps 310 and 320 for such verification. The automated system may check how many individual bit cell failures are present at 330. If there are no bit cell failures, the die may be declared a "good die" at 340. If there are more than N individual failed bit cells, where N is related to the size of the redundant information row (or other similar reserved portion of memory), then the die may be declared as a failed die at 350. In other words, a determination is made as to whether sufficient redundant storage space is available (e.g., in the one or more redundant information row(s) available) to accommodate (store) information associated with addresses (and redundancy flags, and payload bits) of all the individual failed bit cells. If the number of individual failed bit cells is between 1 and N, indicating that the RIR is large enough to accommodate all the failed bit cells, then the address of each failed bit cell is written to the RIR at 360. The correct payload data (data intended to be stored at the failed bit cell but not actually stored due to the failure) may be written to the RIR as well.

In some embodiments, the RIR (more precisely, the data therein) is loaded directly to a register at 370. Each time a memory access is attempted, an access to the register determines whether the memory address to be accessed is a failed or non-failed address. An access is made to a failure address (an address that corresponds to a failed bit cell) via the register instead of via the memory at 380. Thus, the die is effectively repaired (the failed bit cells are effectively repaired) at 390, because a mechanism is in place to transparently provide access to bit cells (using the addresses of those bit cells) that have themselves failed but which have been effectively backed up via an RIR and optionally a register. An attempt to access a failed bit results in payload data being accessed at the register (read from the register or written to the register). An attempt to access a non-failed (working) bit results in a memory access.

Thus, the user may use an automated system that is set up to determine which bit cells (if any) have failed and write corresponding information to the RIR. A mapping as in FIG. 1B may be employed, or any other mapping may be used that is agreed upon by the manufacturer and user (so that the user can suitably instruct an automated system as to how many bits are available for the RIR, and with what bit assignments, based on the size of the array provided by the manufacturer).

The RIR may be sized with various considerations, including based on the size of the array desired to be protected and the number of individual failure bit cells contemplated (desired to be protected against/repaired). Reserving an entire row for redundancy purposes as in various embodiments is efficient because: (1) failed bits from two or more rows or columns of memory can be repaired using a single RIR, and (2) it is not necessary to provide redundant bits for memory cells that have not failed (even if they are located in the same row or column as a failed bit).

In some embodiments, the load to the register at 370 occurs once (a single time) at power-up. Loading the register with the contents of the RIR provides fast access for subsequent operations involving accesses to data corresponding of failed bit cells via the register. The register contents may be stored at least until a power-down or power-off (power cut off) event.

Figure 4:
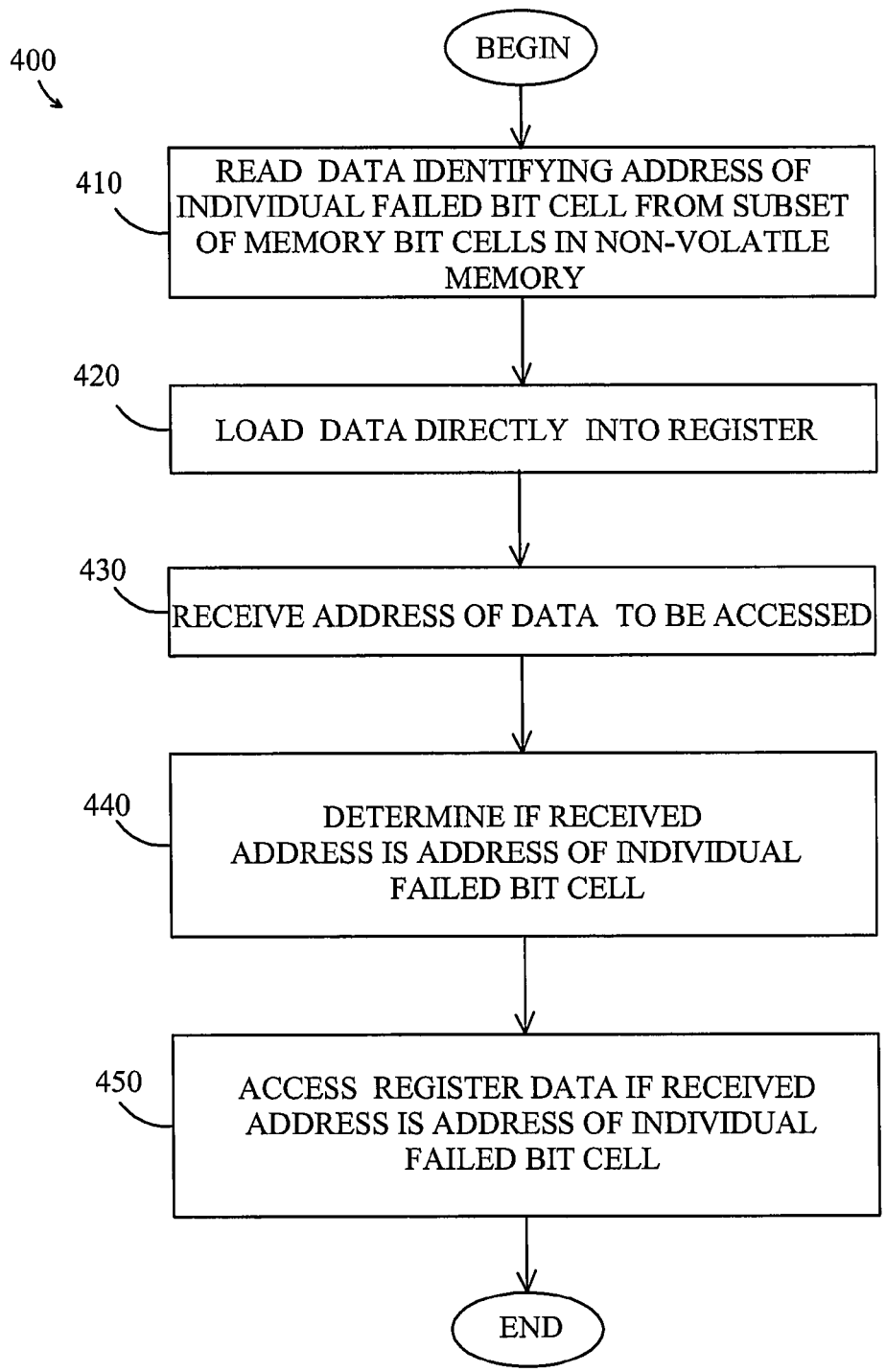
FIG. 4 is a flow diagram of another process in accordance with some embodiments.

FIG. 4 is a flow diagram of another process in accordance with some embodiments. After process 400 begins, one or more data is read at 410 from a subset of a plurality of memory bit cells of a non-volatile memory. The subset identifies an address of at least one individual failed bit cell. The subset may be a redundant information row or column. The one or more data is loaded directly into a register at 420. At 430, an address of data to be accessed is received. At 440, an address comparison is performed to determine if the received address matches the address of any of the one or more individual failed bit cells. At 450, data of the register is accessed (i.e., the register is written to or read from) if the received address matches the address of an individual failed bit cell.

Figure 5:
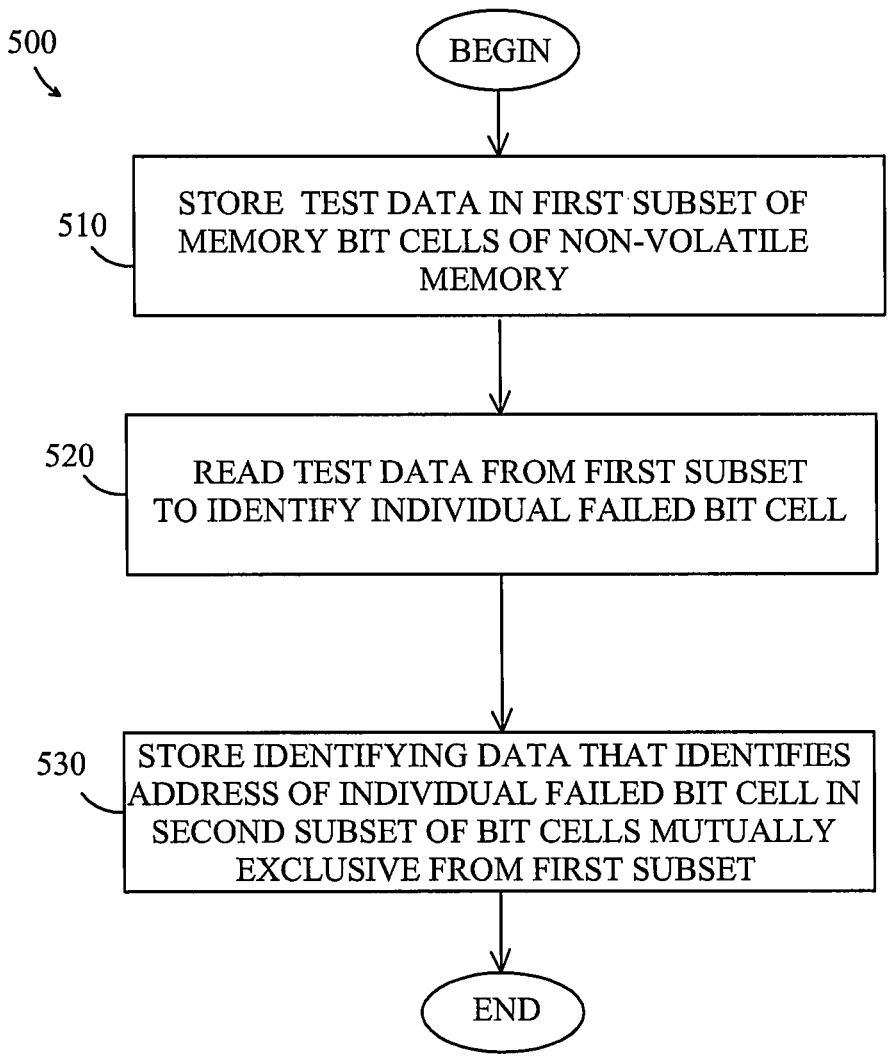
FIG. 5 is a flow diagram of another process in accordance with some embodiments.

FIG. 5 is a flow diagram of another process in accordance with some embodiments. After process 500 begins, test data is stored at 510 in a first subset of a plurality of memory bit cells of a non-volatile memory. The first subset may correspond to the rows (or columns) other than row 110-R in FIG. 1A. At 520, the test data is read from the first subset to identify at least one individual failed bit cell. At 530, identifying data that identifies an address of an individual failed bit cell is stored in a second subset of the plurality of memory bit cells. The second subset may be a redundant information row (RIR) or column, or another portion of memory that is reserved for storage of information associated with bit cell repair.

Although an example is provided in which the redundancy information is stored in a row, other embodiments provide one or more redundancy information columns to store the same information (including the redundancy flag, address, and payload data) in a different format.

In some embodiments, a system for data storage has multiple memory bit cells in a non-volatile memory, and a memory access circuit. The memory bit cells include a first subset configured to store first data and a second subset, mutually exclusive from the first subset, reserved for storage of second data identifying an address of an individual failed bit cell. The memory access circuit is configured to read the second data from the second subset, load the second data directly into a register; receive an address of data to be accessed; determine if the received address is the address of the individual failed bit cell; and access the data of the register if the received address is the address of the individual failed bit cell.

Embodiments may be utilized in the context of an e-fuse, e-flash, or one-time programming (OTP) memory to provide fast, efficient repair of bit cells, e.g., with automatic placement and routing (APR) tools. Logical bit cell repair as in various embodiments enables the targeting of individual bit cells to be repaired and avoids the need for large blocks of physical storage structures that might be wasted on backing up functioning (working) bit cells using prior art row or bit line repair techniques.

Additionally, various embodiments avoid the need to know the contents of all bits of a failed word line, which may come from a different program stage, e.g., a circuit probe or a package-level tester and which may be unavailable or inconvenient to ascertain.

Although examples are illustrated and described herein, embodiments are nevertheless not limited to the details shown, since various modifications and structural changes may be made therein by those of ordinary skill within the scope and range of equivalents of the claims.

What is claimed is:

1. A method comprising:
   reading first data from a first subset of a plurality of memory bit cells of a non-volatile memory, the first data including address data identifying an address of at least one individual failed bit cell and payload data associated with the at least one individual failed bit cell;
   loading the first data directly into a register;
   receiving an address of data to be accessed;
   determining if the received address is the address of any individual failed bit cell; and
   reading a payload bit from a predetermined position of the register responsive to a determination that the received address is the address of any individual failed bit cell, wherein reading the payload bit from the register repairs a failed memory bit cell at the received address.

2. The method of claim 1, further comprising reading the payload bit from one of the bit cells at the received address responsive to a determination that the received address is not the address of any individual failed bit cell.

3. The method of claim 1, further comprising:
   storing second data in a second subset of the plurality of bit cells, the second subset being mutually exclusive from the first subset;
   reading the second data from the second subset to identify the failed bit cell; and
   storing the first data in the first subset of the plurality of memory cells.

4. The method of claim 1, wherein reading the first data from the first subset includes reading the first data from the first subset a single time responsive to a power-up event.

5. The method of claim 1, further comprising storing the first data in the register at least until a power-down event or a power-off event.

6. The method of claim 1, wherein the non-volatile memory is selected from the group consisting of e-fuse memory, e-flash memory, and one-time programming (OTP) memory.

7. The method of claim 1, wherein the bit cells are arranged in rows and columns, and the first subset is one of the rows.

8. A system for data storage comprising:
   a plurality of memory bit cells in a non-volatile memory, the plurality of memory bit cells including:
      a first subset configured to store first data, and
      a second subset, mutually exclusive from the first subset, reserved for storage of second data including address data identifying an address of at least one individual failed bit cell and payload data associated with the at least one individual failed bit cell; and
   a memory access circuit including a register and a data output switch circuit, the memory access circuit being configured to:
      read the second data from the second subset;
      load the second data directly into the register;
      receive an address of data to be accessed;
      determine, by the register, if the received address is the address of any individual failed bit cell; and
      using the data output switch circuit, read a payload bit from a predetermined position of the register responsive to a determination that the received address is the address of any individual failed bit cell, wherein reading the payload bit from the register repairs a failed memory bit cell at the received address.

9. The system of claim 8, wherein the data output switch circuit is configured to read the payload bit from one of the bit cells at the received address responsive to a determination that the received address is not the address of any individual failed bit cell.

10. The system of claim 8, wherein the bit cells are arranged in rows and columns, and the second subset is one of the rows.

11. The system of claim 8, wherein the non-volatile memory is selected from the group consisting of e-fuse memory, e-flash memory, and one-time programming (OTP) memory.

12. A method comprising:
reading first data from a first subset of a plurality of memory bit cells of a non-volatile memory, the first data including address data identifying an address of at least one individual failed bit cell;
loading the first data directly into a register;
receiving an address of data to be accessed;
determining if the received address is the address of any individual failed bit cell; and
writing a payload bit at a predetermined position of the register responsive to a determination that the received address is the address of any individual failed bit cell, wherein writing the payload bit into the register repairs a failed memory bit cell at the received address.

13. The method of claim 12, further comprising writing the payload bit to one of the bit cells at the received address responsive to a determination that the received address is not the address of any individual failed bit cell.

14. A system for data storage comprising:
a plurality of memory bit cells in a non-volatile memory, the plurality of memory bit cells including:
a first subset configured to store first data, and
a second subset, mutually exclusive from the first subset, reserved for storage of second data including address data identifying an address of at least one individual failed bit cell; and
a memory access circuit including a register and a data output switch circuit, the memory access circuit being configured to:
read the second data from the second subset;
load the second data directly into the register;
receive an address of data to be accessed;
determine, by the register, if the received address is the address of any individual failed bit cell; and
using the data output switch circuit, write a payload bit to a predetermined position of the register responsive to a determination that the received address is the address of any individual failed bit cell, wherein writing the payload bit into the register repairs a failed memory bit cell at the received address.

15. The system of claim 14, wherein the data output switch circuit is further configured to write the payload bit to one of the bit cells at the received address responsive to a determination that the received address is not the address of any individual failed bit cell.

* * * * *